(12) United States Patent
Borghoff et al.

(10) Patent No.: US 8,148,198 B2
(45) Date of Patent: Apr. 3, 2012

(54) METHOD FOR REDUCING VARIATIONS IN THE BENDING OF ROLLED BASE PLATES AND SEMICONDUCTOR MODULE HAVING SUCH A BASE PLATE SENSOR

(75) Inventors: Georg Borghoff, Warstein (DE);
Thomas Nuebel, Warstein (DE);
Reinhold Spanke, Bestwig (DE);
Martin Woelz, Soest (DE)

(73) Assignee: Infineon Technologies AG, Meubiberg (DE)

( * ) Notice: Subject to any disclaimer, the term of this patent is extended or adjusted under 35 U.S.C. 154(b) by 248 days.

(21) Appl. No.: 11/536,357

(22) Filed: Sep. 28, 2006

(65) Prior Publication Data

US 2007/0090157 A1    Apr. 26, 2007

(30) Foreign Application Priority Data

Sep. 28, 2005   (DE) .......................... 10 2005 046 404

(51) Int. Cl.
*H01L 21/00* (2006.01)

(52) U.S. Cl. ........ 438/106; 438/121; 438/122; 257/712; 257/E21.001

(58) Field of Classification Search .................. 438/106; 257/712, E21.001
See application file for complete search history.

(56) References Cited

U.S. PATENT DOCUMENTS

| | | | | |
|---|---|---|---|---|
| 3,950,843 | A * | 4/1976 | Horton et al. | 438/15 |
| 4,396,457 | A * | 8/1983 | Bakermans | 29/827 |
| 6,271,585 | B1 | 8/2001 | Osada et al. | |
| 6,369,411 | B2 * | 4/2002 | Matsumoto | 257/182 |
| 7,276,793 | B2 * | 10/2007 | Sakamoto et al. | 257/739 |
| 2001/0002066 | A1 * | 5/2001 | Mita et al. | 257/693 |
| 2002/0048156 | A1 * | 4/2002 | Saito | 361/749 |
| 2004/0159940 | A1 * | 8/2004 | Hiyoshi | 257/732 |
| 2004/0194861 | A1 | 10/2004 | Endou et al. | |
| 2005/0230791 | A1 * | 10/2005 | Kanda et al. | 257/668 |
| 2006/0263584 | A1 * | 11/2006 | Schulz-Harder et al. | 428/292.1 |
| 2009/0056995 | A1 * | 3/2009 | Maeda et al. | 174/259 |

FOREIGN PATENT DOCUMENTS

EP    1553627 A1    7/2005

* cited by examiner

*Primary Examiner* — Angel Roman
(74) *Attorney, Agent, or Firm* — Dicke, Billig & Czaja, PLLC

(57) ABSTRACT

A method for reducing variations in the bending of rolled metal base plates for semiconductor modules is disclosed. In this method, the base plates are rolled in their longitudinal direction in a specific manner.

4 Claims, 2 Drawing Sheets

METHOD FOR REDUCING VARIATIONS IN THE BENDING OF ROLLED BASE PLATES AND SEMICONDUCTOR MODULE HAVING SUCH A BASE PLATE SENSOR

CROSS-REFERENCE TO RELATED APPLICATIONS

This Utility Patent Application claims priority to German Patent Application No. DE 10 2005 046 404.1 filed on Sep. 28, 2005, which is incorporated herein by reference.

BACKGROUND

The present invention relates to a method for reducing variations in the bending of rolled metal base plates for semiconductor modules; the present invention also relates to a semiconductor module having a semiconductor component which is applied to a base plate that is provided with a heat sink.

As is known, the power loss of semiconductor modules and, in particular, power semiconductor modules, for example IGBTs (Insulated Gate Bipolar Transistor), power transistors, thyristors and so on, is dissipated, via a metal base plate, to a heat sink that is mechanically connected to the base plate. Suitable materials for such base plates are, in particular, copper and aluminum. However, other materials such as alloys and so on are also possible in this case.

A gap is often produced between the base plate and the surface of the heat sink on account of unevennesses or the like. However, this gap should be as small as possible in order to improve the thermal conductivity between the base plate and the heat sink.

A screw connection is one customary possible way of fastening a base plate to a heat sink. That is to say that edge of the base plate which projects beyond the semiconductor component is fastened to the top side of the heat sink by means of screws.

Base plates between the fastening points, that is to say the locations having the screw connections, now usually have a convex shape: they thus have a "positive" bend, so that they are pressed onto the top side of the heat sink when screwed.

If additionally metalized insulating ceramics are soldered, for example, to the top side of the base plate between the latter and the underside of the semiconductor component, a bimetal effect results on account of the different coefficients of thermal expansion of the base plate, on the one hand, and the insulating ceramic, on the other hand. This means that, on account of this bimetal effect, the bending of the base plate during the soldering process is changed when applying the insulating ceramic, considerable variations in this bending occurring.

For the purpose of illustration, FIG. 1 illustrates a semiconductor module 1 including a semiconductor component 2, for example an IGBT having connections 3. The semiconductor component 2 is firmly fitted, via a copper base plate 4, to the top side 5 of a heat sink 6 (having cooling ribs 7) using screws 8. The bending of the base plate 4 can be clearly seen in FIG. 1. This bending is eliminated or compensated for by the screws 8 being screwed into the top side 5 of the heat sink 6 so that the underside of the base plate 4 completely rests on the top side 5 of the heat sink 6.

In order to compensate for the variation in the bending of the base plates 4, the variation being produced by the bimetal effect mentioned, the bending of the base plates is selected, on average, to be larger than is required per se. Greater bending of the individual base plates is thus deliberately accepted in order to compensate for variations in the magnitude of bending. However, such greater bending increases the risk of the ceramic breaking when mounting the module if, in particular, the base plate 4 is screwed to the heat sink 6.

FIG. 2 illustrates a plan view of a base plate 4 for an IGBT module. This base plate has openings 9 for the screws 8 in its longitudinal direction B. The bending in the transverse direction A of the base plate 4 should have as little variation as possible since, in this case, the distance a between the holes 9 for the screws 8 is considerably greater than the distance b between the openings 9 in the longitudinal direction B. In other words, it can be seen in FIG. 2 that the variation in the bending in the longitudinal direction is of lower importance than in the transverse direction since the base plate is pressed onto the top side 5 of the heat sink 6 at short intervals in the longitudinal direction B using the screws 8. Conditions where a is quite generally large in comparison with b are generally present per se in base plates.

As is known, base plates for semiconductor modules are preferably produced by rolling copper sheet, for example. This copper sheet is then punched after rolling, so that the individual base plates are punched from the rolled sheet.

For these and other reasons, there is a need for the present invention.

SUMMARY

One embodiment provides a method for reducing variations in the bending of rolled metal base plates for semiconductor modules. In this method, the base plates are rolled in their longitudinal direction in a specific manner.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is an embodiment of the present invention to specify a method which can be used to considerably reduce the variation in the bending of rolled base plates; in addition, the intention is to provide a semiconductor module which is distinguished by a base plate whose bending has virtually no variation.

In one embodiment, base plates are rolled or have been rolled in a preferred direction, in particular their longitudinal direction.

It is thus possible to produce base plates for semiconductor modules, which base plates are distinguished by as little variation in their bending as possible. The bending is, on average, reduced, thus considerably reducing the risk of the ceramic breaking. In the case of the invention, the microstructure of the base plate, which includes, in particular, copper or aluminum, is changed during rolling in such a manner that the change in the bending of the base plate varies as little as possible when soldering on the insulating ceramic. This slight variation is achieved by virtue of the fact that the base plate is rolled in a preferred direction, in particular its longitudinal direction.

A physical explanation for the reduction in the variation can be seen in the texture or crystallographic preferred orientation which results when rolling a copper sheet, for example. This means that anisotropic elasticity is introduced into the material of the base plate.

When cooling the base plate and the insulating ceramic after soldering, the bending of the base plate greatly depends on its bending stiffness. Fluctuations in the rolling process and in the resultant rolled texture influence the bending stiffness to differing degrees in the rolling direction and transverse to the latter, with the result that different variations in both directions, that is to say in the longitudinal direction of the base plate and in the transverse direction of the base plate, result.

Figure 1:
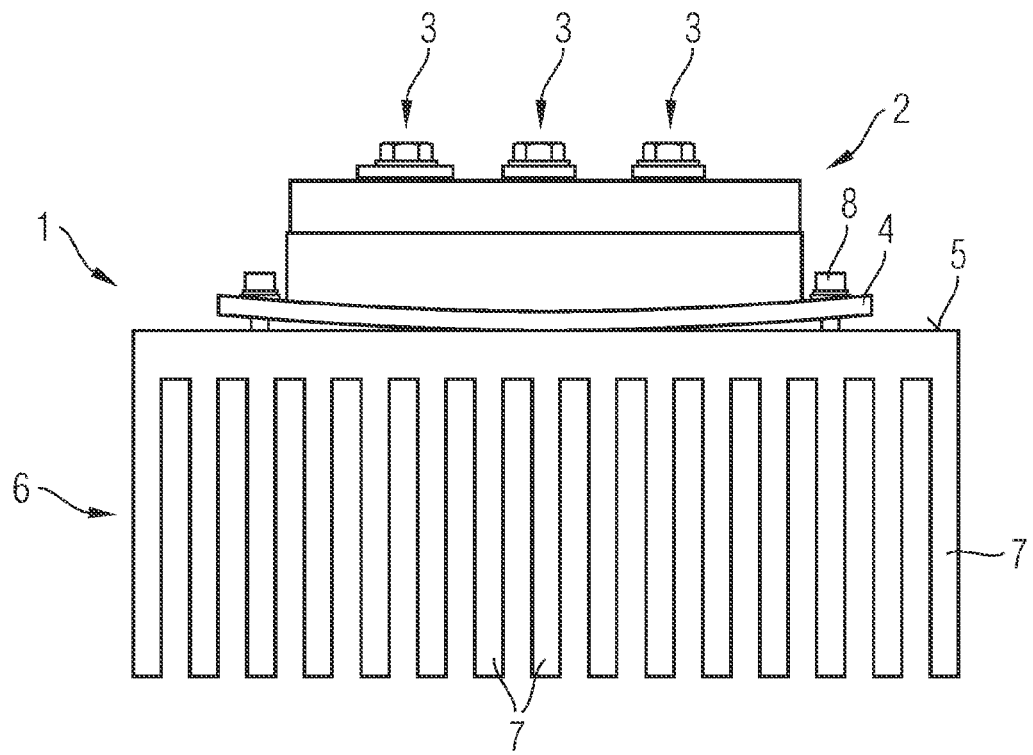
FIG. 1 illustrates a side view of a semiconductor module.
Figure 2:
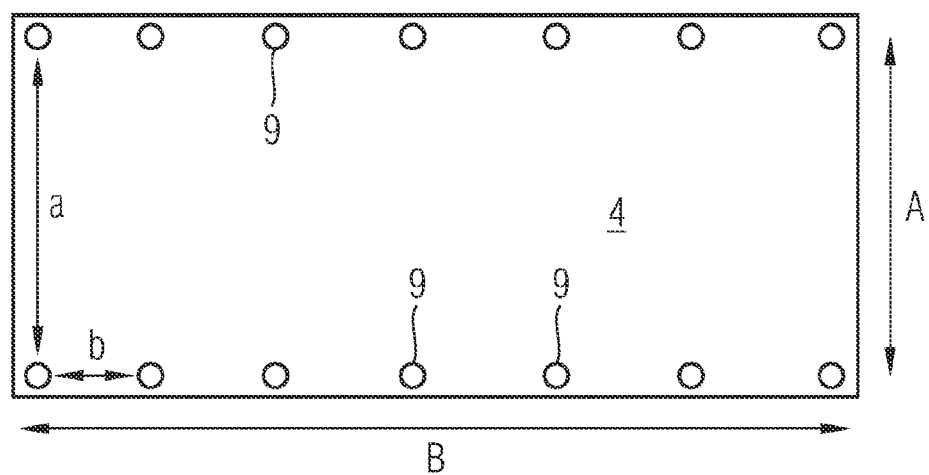
FIG. 2 illustrates a plan view of a base plate.

FIGS. 1 and 2 have already been explained at the outset. In the figures, the same reference symbols are respectively used for components which correspond to one another.

Figure 3A:
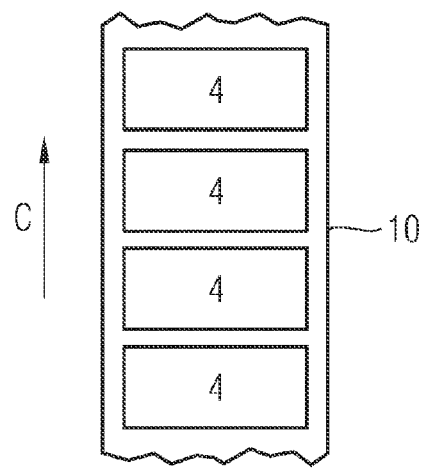
FIGS. 3A and 3B illustrate the position of base plates in a rolled sheet, with base plates lying transverse to the rolling direction (FIG. 3A) and base plates lying along the rolling direction (FIG. 3B).

FIG. 3A illustrates how base plates 4 have hitherto been punched from a rolled sheet 10 including copper, for example, the longitudinal direction of the base plates 4 lying transverse to the rolling direction C of the rolled sheet 10 in this case. That is to say the rolled sheet 10 is rolled in the rolling direction C and the base plates are then punched from the rolled sheet 10 in such a manner that their longitudinal direction runs transverse to the rolling direction C.

The inventors have now realized that a specific selection of the rolling direction C and longitudinal direction of the base plates is of very decisive importance for reducing the variation in the bending of the base plates. That is to say, if the rolled sheet 10 is rolled in such a manner that the longitudinal direction of the punched base plates 4 coincides with the rolling direction C, as illustrated in FIG. 3B, the variation in the bending is considerably less.

Figure 4:
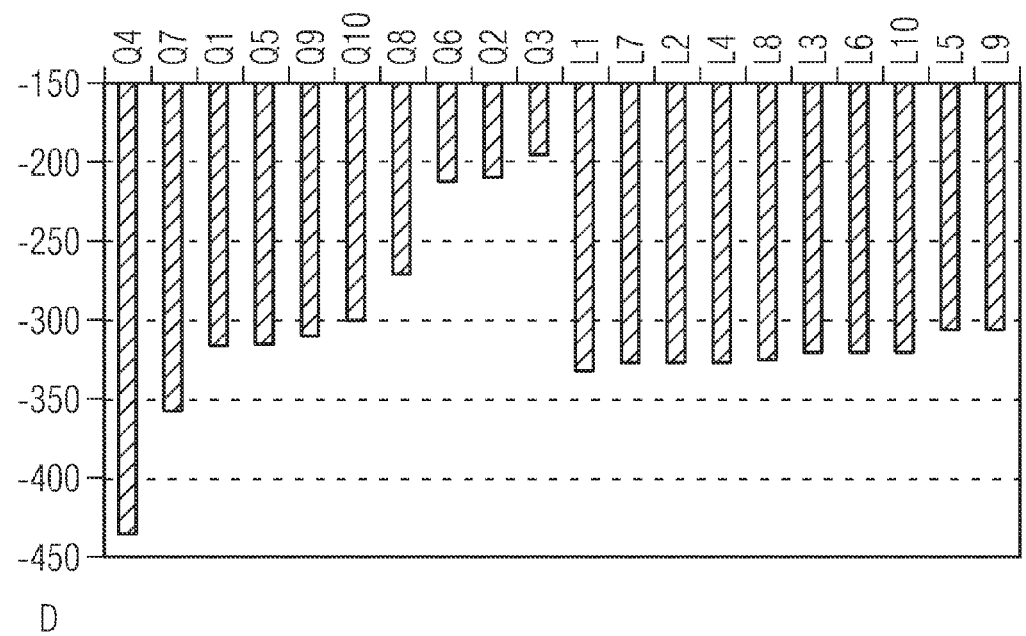
FIG. 4 illustrates a graph for explaining the variation in the bending for rolling directions transverse to the longitudinal direction of the base plates and in the longitudinal direction of the base plates.

In this respect, reference is made to FIG. 4 which illustrates test results, the results for samples L1 to L10 of base plates which have been rolled in the longitudinal direction and for samples Q1 to Q10 of base plates which have been rolled in the transverse direction being illustrated in this case. The bending D in μm is indicated on the ordinate, the base plates in both variants having been respectively brought to a bend of 0±10 μm in a press before soldering.

Figure 3B:
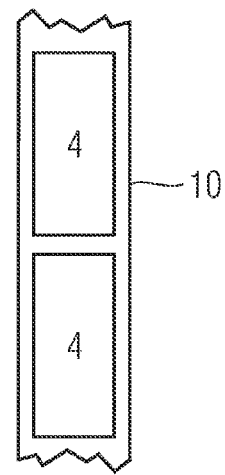

It can now be clearly seen from FIG. 4 that the variation in the bending is considerably greater for base plates which have been rolled in the transverse direction in accordance with the variant of FIG. 3A than for base plates which have been rolled in the longitudinal direction in accordance with the variant of FIG. 3B.

Even in the case of a finished semiconductor module, it is possible to readily determine, by examining the microstructure of the base plate, how the latter was rolled. This is readily possible by means of X-ray diffractometry using a texture goniometer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of making a semiconductor module comprising:
   producing a semiconductor component;
   providing a sheet having a rolling direction said sheet being made of a material which is selected from the group consisting of copper and aluminum;
   rolling the sheet in a rolling direction so as to introduce an anisotropic elasticity and a crystallographic preferred orientation into the material of the rolled sheet;
   making a base plate from the rolled sheet by punching the base plate from the rolled sheet, the base plate having a longitudinal direction and a transverse direction generally orthogonal to the longitudinal direction, wherein the longitudinal direction of the base plate corresponds to the rolling direction; and the transverse direction of the base plate is transverse to the rolling direction;
   attaching the semiconductor to the base plate; and
   fastening a heat sink to the base plate using screws at fastening points, on a major surface opposite the semiconductor component, a distance between holes in the base plate at the fastening points for the screws being considerably greater in the transverse direction than in the longitudinal direction and considerably smaller in the rolling direction than in the transverse direction.

2. A semiconductor module comprising:
   a semiconductor component having a semiconductor longitudinal direction;
   a rolled base plate, having a longitudinal direction corresponding to a rolled direction and a transverse direction generally orthogonal to the longitudinal direction, where the semiconductor component is applied to the base plate such that the semiconductor longitudinal direction corresponds to the longitudinal direction of the rolled base plate, and where the rolled base plate has a crystallographic preferred orientation in the rolled direction; and
   a heat sink attached to the base plate by screws at fastening points, a distance between holes in the base plate at the fastening points for the screws being considerably greater in the transverse direction than in the longitudinal direction and considerably smaller in the rolling direction than in the transverse direction.

3. The semiconductor module of claim 2, comprising:
   where the rolled base plate is made of rolled copper.

4. The semiconductor module of claim 2, comprising:
   where the rolled base plate is made of rolled aluminum.

* * * * *